(12) United States Patent
Wang

(10) Patent No.: US 11,385,628 B2
(45) Date of Patent: Jul. 12, 2022

(54) SCHEDULING SUBSTRATE ROUTING AND PROCESSING

(71) Applicant: Applied Materials, Inc., Santa Clara, CA (US)

(72) Inventor: Chongyang Wang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 26 days.

(21) Appl. No.: 16/911,125

(22) Filed: Jun. 24, 2020

(65) Prior Publication Data
US 2021/0405625 A1    Dec. 30, 2021

(51) Int. Cl.
*G05B 19/418* (2006.01)
*H01L 21/67* (2006.01)

(52) U.S. Cl.
CPC ..... *G05B 19/4187* (2013.01); *G05B 19/4183* (2013.01); *H01L 21/67276* (2013.01)

(58) Field of Classification Search
None
See application file for complete search history.

(56) References Cited

U.S. PATENT DOCUMENTS

| | | |
|---|---|---|
| 7,379,782 B1 | 5/2008 | Cocco |
| 8,527,080 B2 | 9/2013 | Assaf et al. |
| 10,359,769 B2 | 7/2019 | Emani |
| 10,698,392 B2 | 6/2020 | Emani |
| 2003/0130756 A1 | 7/2003 | Baweja et al. |
| 2008/0216077 A1 | 9/2008 | Emani et al. |
| 2013/0226336 A1 | 8/2013 | Hoffman et al. |
| 2020/0013654 A1 | 1/2020 | Matsuhashi et al. |

FOREIGN PATENT DOCUMENTS

CN    111242417 A    6/2020

OTHER PUBLICATIONS

Rhee, Adrian "Predictive Wafer Scheduling for Multi-Chamber Semiconductor Equipment"; U.S. Appl. No. 16/881,370, filed May 22, 2020.
International Search Report and Written Opinion for International Application No. PCT/US2021/038753, dated Oct. 15, 2021.

*Primary Examiner* — Carlos R Ortiz Rodriguez
(74) *Attorney, Agent, or Firm* — Lowenstein Sandler LLP

(57) ABSTRACT

A method includes identifying a bottleneck operation of a plurality of operations in a sequence recipe. The plurality of operations are associated with transporting and processing a plurality of substrates in a substrate processing system. The method further includes determining, based on the bottleneck operation, a takt time for the plurality of substrates. The takt time is an amount of time between a first substrate entering the substrate processing system and a second substrate entering the substrate processing system. The method further includes determining a plurality of queue times. Each of the plurality of queue times corresponds to a respective operation of the plurality of operations. The method further includes causing, based on the takt time and the plurality of queue times, the plurality of substrates to be processed by the substrate processing system.

17 Claims, 6 Drawing Sheets

SCHEDULING SUBSTRATE ROUTING AND PROCESSING

TECHNICAL FIELD

The present disclosure relates to scheduling in manufacturing systems, such as substrate processing systems, and in particular to scheduling substrate routing and processing in a manufacturing system.

BACKGROUND

Products are produced by performing one or more manufacturing processes using manufacturing equipment. For example, substrate processing equipment is used to produce substrates by transporting substrates to processing chambers and performing processes on the substrates in the processing chambers.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes identifying a bottleneck operation of a plurality of operations in a sequence recipe. The plurality of operations are associated with transporting and processing a plurality of substrates in a substrate processing system. The method further includes determining, based on the bottleneck operation, a takt time for the plurality of substrates. The takt time is an amount of time between a first substrate entering the substrate processing system and a second substrate entering the substrate processing system. The method further includes determining a plurality of queue times. Each of the plurality of queue times corresponds to a respective operation of the plurality of operations. The method further includes causing, based on the takt time and the plurality of queue times, the plurality of substrates to be processed by the substrate processing system.

In another aspect of the disclosure, a non-transitory machine-readable storage medium storing instructions which, when executed cause a processing device to identify a bottleneck operation of a plurality of operations in a sequence recipe. The plurality of operations are associated with transporting and processing a plurality of substrates in a substrate processing system. The processing device is further to determine, based on the bottleneck operation, a takt time for the plurality of substrates. The takt time is an amount of time between a first substrate entering the substrate processing system and a second substrate entering the substrate processing system. The processing device is further to determine a plurality of queue times. Each of the plurality of queue times corresponds to a respective operation of the plurality of operations. The processing device is further to cause, based on the takt time and the plurality of queue times, the plurality of substrates to be processed by the substrate processing system.

In another aspect of the disclosure, a system includes memory and a processing device coupled to the memory. The processing device is to identify a bottleneck operation of a plurality of operations in a sequence recipe. The plurality of operations are associated with transporting and processing a plurality of substrates in a substrate processing system. The processing device is further to determine, based on the bottleneck operation, a takt time for the plurality of substrates. The takt time is an amount of time between a first substrate entering the substrate processing system and a second substrate entering the substrate processing system. The processing device is further to determine a plurality of queue times. Each of the plurality of queue times corresponds to a respective operation of the plurality of operations. The processing device is further to cause, based on the takt time and the plurality of queue times, the plurality of substrates to be processed by the substrate processing system.

BRIEF DESCRIPTION OF THE DRAWINGS

The present disclosure is illustrated by way of example, and not by way of limitation in the figures of the accompanying drawings.

DETAILED DESCRIPTION

Figure 1A:
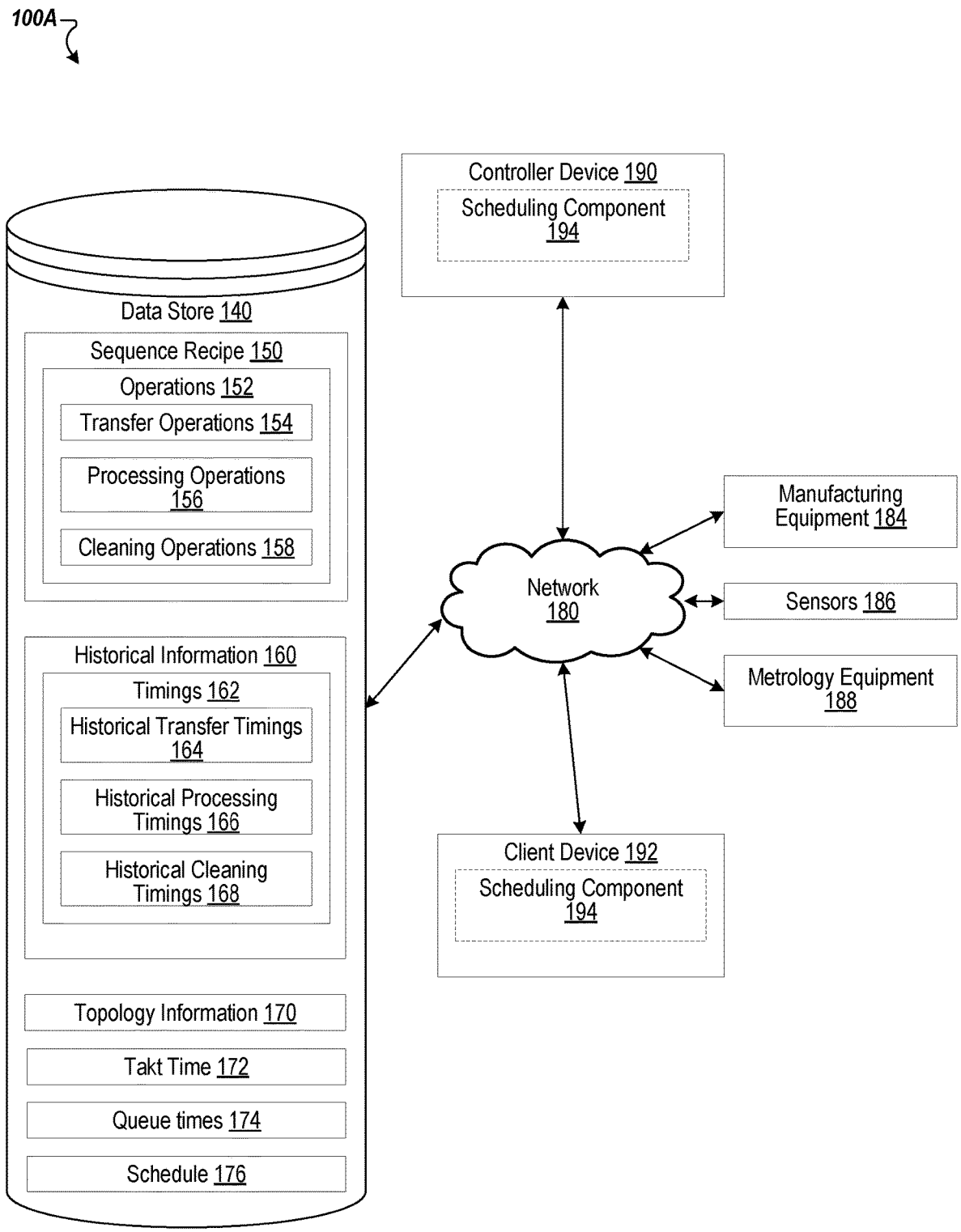
FIG. 1A is a block diagram illustrating an exemplary system architecture, according to certain embodiments.

Described herein are technologies directed to scheduling substrate routing and processing.

Products are produced by performing one or more manufacturing processes using manufacturing equipment. For example, substrate processing equipment is used to process substrates (e.g., wafers, semiconductors, displays, etc.). A substrate processing system processes substrates based on a sequence recipe that includes different operations such as transfer operations (e.g., robots transporting substrates to different locations), processing operations (e.g., processing substrates in processing chambers), cleaning operations (e.g., cleaning the processing chamber after a processing operation), and/or the like. For example, in semiconductor processing, multi-layer features are fabricated on substrates using specific processing sequence recipes having multiple processing operations. The substrate processing system (e.g., cluster tool) includes multiple processing chambers to perform a process sequence (e.g., sequence of process recipe operations completed in processing chambers of the cluster tool) of a sequence recipe without removing the substrates from the processing environment (e.g., of the substrate processing system). A substrate processing system has a limited amount of robots to perform the transfer operations and a limited amount of processing chambers to perform the processing operations. For a substrate to move on to the next operation, the substrate is to complete the preceding operation, the corresponding type of processing chamber is to be available, and a corresponding robot is to be available.

In conventional systems, the substrate transfer operations and processing operations are controlled based on the current state of the system. Given the different possible routings of substrates to different possible processing chambers via different possible robots, in conventional systems, wafers are routed in many different random orders with inconsistent timings. The randomness of routings and different timings cause different wait times of substrates in different processing chambers, random delays, and decreased throughput. In conventional systems, different substrates will exhibit different behavior based on the state of the system. For example, a first substrate is not to have any wait time since the resources (e.g., robots, processing chambers, etc.) are available at this point. A subsequent substrate is to wait in the chamber if the next chamber is processing the previous substrate. The different wait times of substrates causes non-uniformity (e.g., inconsistency, un-uniform substrate surface properties) among the substrates. For example, in a thermal process, the more the substrate waits after the thermal operation is complete, the lower the temperature of the substrate will be, causing non-uniform surface temperature at the next operation in the sequence. For another example, in a wet process, the more the substrate waits after a wet chemical process operation is completed, the more chemical reaction will be on the surface of the substrate.

The randomness of routings and different timings causes the completion time of a batch of substrates to be unknown, causing further delays in removal of the batch of substrates (e.g., removing a cassette of processed substrates) and providing a new batch of substrates (e.g., docking a new cassette of unprocessed substrates) to the substrate processing system. In conventional systems, substrate-to-substrate consistency is not enforced and throughput is decreased due to randomness and delays.

In conventional systems, a substrate is transferred to the next process location if the next process location is empty and the robot is available. However, such "move when possible" logic causes deadlock if the sequence flow has revisit operations. For example, deadlock occurs where first chamber ($CH_A$) or second chamber ($CH_B$) perform 50 second (s) processes and are followed by third chamber ($CH_C$) or fourth chamber ($CH_D$) which perform 200 s processes, which is followed by $CH_A$ or $CH_B$ (50 s process). If the first substrate is in $CH_C$ running a 200 s process, the second substrate is in $CH_D$ also running a 200 s process, and $CH_A$ and $CH_B$ are empty, the conventional system will move the third substrate to $CH_A$ running a 50 s process and will move the fourth substrate to $CH_B$ running a 50 s process. After the first and second substrates complete the processes in $CH_C$ and $CH_D$, the next operation on the first and second substrates is to be performed at $CH_A$ and $CH_B$, but since $CH_A$ and $CH_B$ are occupied by the third and fourth substrates, the deadlock happens. Speeding up the sequence recipe (e.g., a more aggressive feeding speed) causes deadlock in the substrate processing system (e.g., which causes further delays, un-uniformity of substrates, and damage to wafers and the substrate processing system) and-slowing down the sequence recipe (e.g., a less aggressive feeding speed) causes decreased throughput. Given the randomness of routings, different timings, and unknown completion times, conventional systems are often faced with deadlocks and/or decreased throughput.

The devices, systems, and methods disclosed herein provide scheduling of sequence recipe operations, such as substrate routing, substrate processing, processing chamber cleaning, and/or the like in a substrate processing system (e.g., integrated processing system). The devices, systems, and methods control (e.g., via a processing device executing a sequencer and/or takt control) substrate routing and processing in the substrate processing system for improved system throughput and improved substrate-to-substrate consistency.

A processing device receives topology information of the substrate processing system and historical timing information associated with operations of a sequence recipe. The operations of the sequence recipe include one or more of transfer operations to transport substrates in the substrate processing system, processing operations to process substrates in the substrate processing system, cleaning operations to clean the processing chambers that perform the processing operations, and/or the like. The historical timing information includes one or more of historical transfer timings (e.g., historical pick-up time, drop-off time, transfer time, etc.), historical processing timings (e.g., per type of processing chamber, per type of processing operation), historical cleaning timings (e.g., per type of processing chamber, per type of processing operation), and/or the like.

The processing logic identifies a bottleneck operation of the operations of the sequence recipe. The bottleneck operation takes longer than other operations in the sequence recipe. The processing device determines, based on the bottleneck operation, a takt time (e.g., pace time, interval, rate of entrance, etc.) for the substrates. The takt time is an amount of time between a first substrate entering the substrate processing system and a subsequent substrate entering the substrate processing system.

The processing device further determines queue times (e.g., process recipe padding time) so that there is not a conflict among the substrate transfer tasks associated with the same robot. Each of the queue times corresponds to a respective operation (e.g., processing operation) of the operations of the sequence recipe. A queue time is an artificial delay of a substrate after completion of an operation (e.g., being processed).

The processing device causes, based on the takt time and the queue times, the substrates to be processed by the substrate processing system. The processing device causes a new substrate to enter the substrate processing system every takt time (e.g., after a set amount of time) and causes different substrates to be wait in different chambers based on a corresponding queue time.

In some embodiments, the processing device generates a schedule (e.g., timetable) based on the takt time and the queue times and causes the substrates to be processed based on the schedule.

Aspects of the present disclosure result in technological advantages. By causing the substrates to be processed based on the takt time and the queue times, deadlocks and delays are avoided, a greater throughput is achieved, and more uniformity among substrates is achieved compared to conventional systems. By causing substrates to be processed based on the takt time and queue times, completion time of the batch of substrates is more accurately predicted which allows the processed batch of substrates to be removed without delay and allows a new batch of substrates to be provided without delay. This improves throughput of processing of batches of substrates compared to conventional systems.

Although some embodiments of the present disclosure describe transporting and processing substrates in a substrate processing system, the present disclosure, in some embodiments, is applied to other systems, such as manufacturing systems, etc. that perform operations over time.

FIG. 1A is a block diagram illustrating a system 100A (e.g., an exemplary system architecture, computing environment), according to certain embodiments. The system 100A includes a client device 192, manufacturing equipment 184 (e.g., cluster tool, substrate processing equipment), sensors 186, metrology equipment 188, a controller device 190 (e.g., controller, server), and a data store 140.

The client device 192, manufacturing equipment 184, sensors 186, metrology equipment 188, controller device 190, and are coupled to each other via a network 180 for causing substrates to be processed based on takt time 172 and queue times 174 (e.g., based on a schedule 176). In some embodiments, network 180 is a public network that provides client device 192 with access to the controller device 190, data store 140, and other publically available computing devices. In some embodiments, network 180 is a private network that provides client device 192 access to manufacturing equipment 184, sensors 186, metrology equipment 188, data store 140, and other privately available computing devices. Network 180 include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The controller device 190 (e.g., controller, server) includes one or more computing devices such as a rack-mount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc. In some embodiments, the controller device 190 includes a scheduling component 194 for causing substrates to be processed based on takt time 172 and queue times 174 (e.g., based on a schedule 176). In some embodiments, the scheduling component 194 is used to perform one or more operations of methods 200A-B of FIGS. 2A-B. In some embodiments, controller device 190 is a controller of a semiconductor processing system and is used to control the manufacturing equipment 184.

The client device 192 includes a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. In some embodiments, the client device 192 displays a Graphical User Interface (GUI) to receive input and to display output. In some embodiments, the client device 192 includes a scheduling component 194 for causing substrates to be processed based on takt time 172 and queue times 174 (e.g., based on a schedule 176). In some embodiments, the scheduling component 194 is used to perform one or more operations of methods 200A-B of FIGS. 2A-B.

In some embodiments, a sequence recipe 150 is provided to the client device 192 (e.g., via user input). The sequence recipe 150 describes what possible processing chambers a substrate will visit at different stages and the process to be run in each chamber. The client device 192 then generates a schedule 176 (e.g., based on takt time 172 and queue times 174) for the substrate movements so that substrates can be processed by manufacturing equipment 184 (e.g., in a cluster tool) in a consistent timing with improved throughput.

In some embodiments, the scheduling component 194 is a takt control component that identifies the bottleneck operation of the substrate processing flow on the manufacturing equipment 184 (e.g., cluster tool), resolves resource conflicts, and then generates consistent schedule 176 (e.g., based on takt time 172 and queue times 174) for substrates. In some embodiments, client device 192 transfers the schedule 176 (e.g., substrate processing schedule and instructions) to the controller device 190 (e.g., controller) and the controller device 190 causes the substrates to be processed by manufacturing equipment 184 based on the schedule 176.

In some embodiments, the manufacturing equipment 184 (e.g., cluster tool) is part of a substrate processing system (e.g., integrated processing system). The manufacturing equipment 184 includes one or more of an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber.

The manufacturing equipment 184 includes one or more processing chambers to produce substrates based on a sequence recipe 150, takt time 172, and queue times 174. The sequence recipe 150 includes a set of operations 152 to produce features (e.g., deposit layers, fabricate multi-layer features) on a substrate.

The sensors 186 provide sensor data (e.g., sensor values, trace data) associated with manufacturing equipment 184 (e.g., associated with producing, by manufacturing equipment 184, substrates). In some embodiments, the sensor data is used to determine manufacturing parameters of the manufacturing equipment 184. In some embodiments, the sensor data is used for equipment health and/or product health (e.g., substrate quality). The manufacturing equipment 184 produces substrates following a sequence recipe 150 based on the takt time 172 and queue times 174 (e.g., schedule 176) over a period of time. Sensor data (e.g., trace data) is received from different sensors 186 over a period of time (e.g., corresponding to at least part of a sequence recipe 150 or run).

The metrology equipment 188 is used to determine metrology data corresponding to products of the manufacturing equipment 184. In some embodiments, after the manufacturing equipment 184 deposits one or more layers on a substrate, the metrology equipment 188 is used to determine one or more of thicknesses of the layers, uniformity of the layers, interlayer spacing of the layer, or the like. In some embodiments, the metrology equipment 188 includes an imaging device.

Data store 140 is a memory (e.g., random access memory), a drive (e.g., a hard drive, a flash drive), a database system, or another type of component or device capable of storing data. Data store 140 includes multiple storage components (e.g., multiple drives or multiple databases) that span multiple computing devices (e.g., multiple server computers). The data store 140 stores sequence recipe 150, historical information 160, topology information 170, takt time 172, queue times 174, and schedule 176 (e.g., schedule in a file).

Sequence recipe 150 includes operations 152. Operations 152 include transfer operations 154 (e.g., robot operation), processing operations 156 (e.g., chamber operation), and cleaning operations 158.

Historical information 160 includes timings 162. Timings 162 include historical transfer timings 164, historical processing timings 166, and historical cleaning timings 168.

Topology information 170 includes information regarding the manufacturing equipment 184 (e.g., components, quantities, capabilities, etc.).

Takt time 172 (e.g., pace time, interval, rate of entrance, etc.) of substrates is an amount of time between a first substrate entering the substrate processing system and a subsequent substrate entering the substrate processing system.

Queue times 174 correspond operations 152 (e.g., processing operations 156) of the sequence recipe 150. A queue time 174 is an artificial delay of a substrate after completion of an operation 152 (e.g., processing operation 156).

Schedule 176 (e.g., timetable) is based on the takt time 172 and the queue times 174. Schedule 176 is for processing a batch of substrates. Schedule 176 defines tasks for manufacturing equipment 184 (e.g., involved chambers and transporters) to complete the assigned processing sequence on each substrate to provide improved uniformity of the substrates and improved throughput.

In some embodiments, data store 140 stores sensor data (e.g., as historical information 160) from sensors 186. Sensor data include values of one or more of temperature (e.g., heater temperature), spacing (SP), pressure, High Frequency Radio Frequency (HFRF), Low Frequency Radio Frequency (LFRF), Radio Frequency (RF) power, voltage of Electrostatic Chuck (ESC), electrical current, flow, power, voltage, etc. In some embodiments, sensor data is associated with or indicative of manufacturing parameters such as hardware parameters (e.g., settings or components (e.g., size, type, etc.) of the manufacturing equipment 184) or process parameters of the manufacturing equipment. The sensor data is provided while the manufacturing equipment 184 is performing manufacturing processes (e.g., equipment readings when processing products). In some embodiments, the sensor data is different for each substrate and/or layer.

In some embodiments, data store 140 stores metrology data (e.g., as historical information 160) from metrology equipment 188. Metrology data includes image data, thickness values, interlayer spacing values, uniformity values, performance data, whether layers of a substrate meet threshold values, an indication of variance in the layers of the substrate, property data of substrates, yield, substrate spatial film properties, dimensions (e.g., thickness, height, etc.), dielectric constant, dopant concentration, density, defects (e.g., whether a substrate and/or layer meets a threshold property, why the substrate and/or layer does not meet a threshold property), and/or the like. In some embodiments, the metrology data is for finished or semi-finished substrates. In some embodiments, the metrology data is different for each substrate and/or layer.

In some embodiments, the sensor data and/or metrology data is used to determine whether the sequence recipe 150, takt time 172, queue times 174, and/or schedule 176 are to be updated (e.g., to improve quality of substrates, health of the manufacturing equipment 184, energy usage, etc.).

For purpose of illustration, rather than limitation, aspects of the disclosure describe causing substrates to be processed based on takt time 172 and queue times 174 (e.g., based on a schedule 176). In some implementations, a heuristic model or rule-based model is used to determine takt time 172 and/or queue times 174. Scheduling component 194 monitors historical information 160 to cause generation of an offset table for recipe 150. In some embodiments, a trained machine learning model is used to determine takt time 172, queue times 174, and/or schedule 176. Historic sequence recipes and historical information are used as data input and historical takt time and historic queue times (e.g., historic schedules are used as target output to train a machine learning model. Recipe 150 and historical information 160 are used as input into the trained machine learning model and takt time 172 and queue times 174 and/or schedule 176 are determined from the output of the trained machine learning model.

In some embodiments, the functions of client device 192 and controller device 190 are provided by a fewer number of machines. In some embodiments, client device 192 and controller device 190 are integrated into a single machine.

In some embodiments, one or more functions described as being performed by client device 192 can also be performed on controller device 190, if appropriate. In some embodiments, one or more functions described as being performed by controller device 190 can also be performed on client device 192, if appropriate. In addition, the functionality attributed to a particular component can be performed by different or multiple components operating together. For example, in some embodiments, the controller device 190 causes generation of the takt time 172 and/or queue times 174 and in some embodiments, the client device 192 causes generation of the takt time 172 and/or queue times 174.

In addition, the functions of a particular component can be performed by different or multiple components operating together. In some embodiments, the controller device 190 is accessed as a service provided to other systems or devices through appropriate application programming interfaces (API).

In embodiments, a "user" is represented as a single individual. However, other embodiments of the disclosure encompass a "user" being an entity controlled by a plurality of users and/or an automated source. For example, a set of individual users federated as a group of administrators is considered a "user."

Although portions of the present disclosure refer to causing substrates to be processed based on takt time 172 and queue times 174 (e.g., based on a schedule 176) via substrate processing in a substrate chamber of a substrate processing system, in some embodiments, the present disclosure is generally applied to performing other processes (e.g., via a manufacturing system) based on takt time and/or queue times.

Figure 1B:
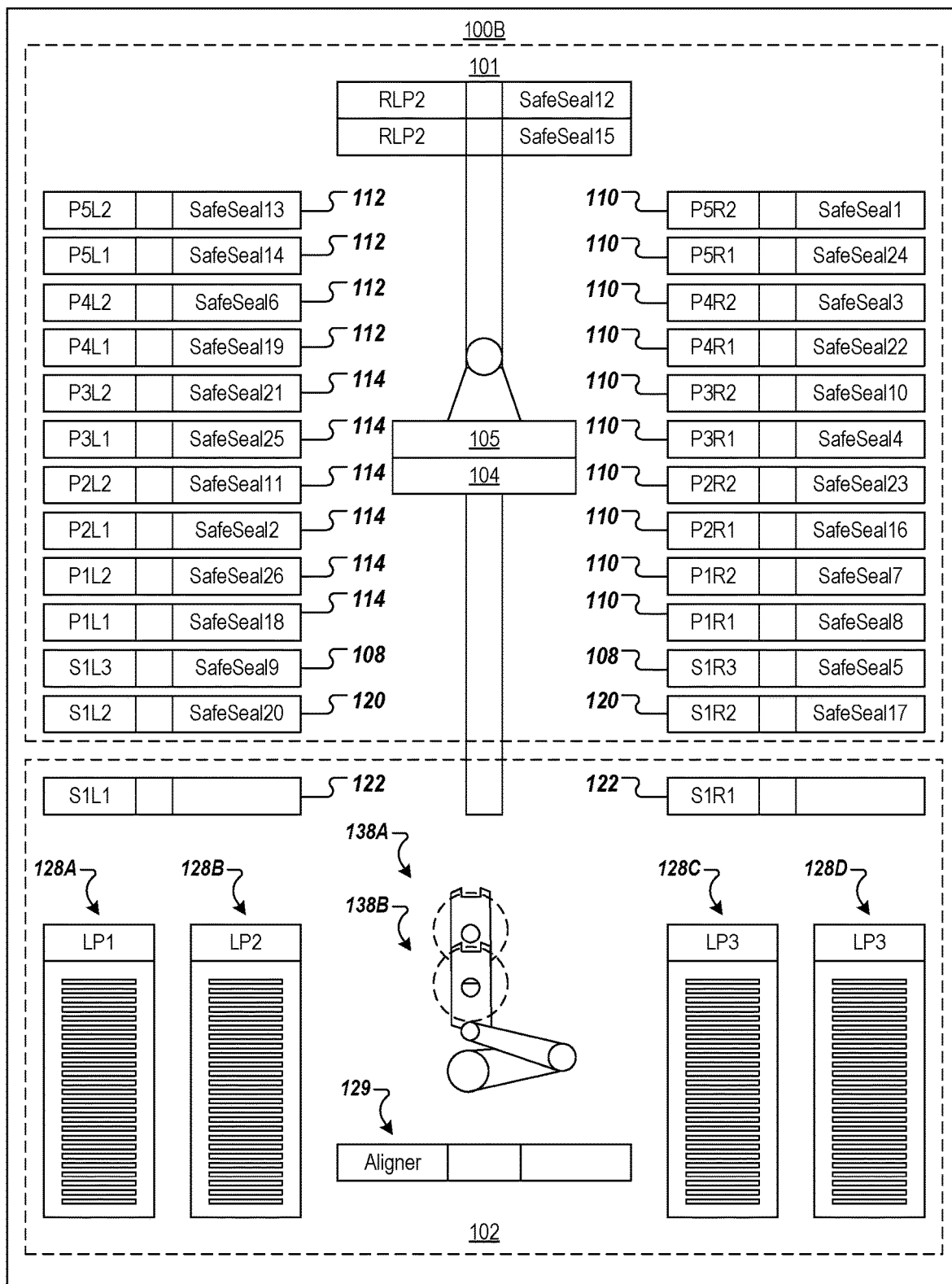
FIG. 1B is a processing system, according to certain embodiments.

FIG. 1B is a processing system 100B (e.g., manufacturing equipment 184, cluster tool for substrate processing), according to certain embodiments. The processing system 100B is configured to perform a sequence recipe 150 (e.g., process sequence). In some embodiments, processing system 100B is the NOKOTA™ Electric Copper Plating tool commercially available from Applied Materials®, Inc. in Santa Clara, Calif.

The processing system 100B includes a transfer chamber 101 (e.g., electric plating processing platform) and a factory interface (FI) 102 (e.g., FI, EFEM). The transfer chamber 101 includes a multiple processing chambers 108, 110, 112, and 114 and two Spinning Ring Maintenance (SRM) chambers 120, which are coupled to transfer chamber robot 104 and 105 (e.g., wet substrate transfer robot). The factory interface 102 is coupled to robot 104 and 105 by the SRM chamber 120.

The factory interface 102 includes at least one docking station (e.g., load port), at least one substrate transfer robot 138, and at least one substrate aligner device 129. The docking station (e.g., load port) is configured to accept one or more front opening unified pods (FOUPs) 128 (e.g., cassette). Three FOUPs 128A, 128n, and 128C are shown in FIG. 1. The substrate transfer robots 138A-B are configured to transfer the substrate from the factory interface 102 to the SRM chambers 120. The aligner device 129 is configured to find the notch on the substrate. The SRD (Spin Rinse Dry) chambers 122 are configured to rinse and dry the substrates. The factory interface robot 138B is configured to transfer substrate between FOUP 128, aligner device 129, and SRM 120. The factory interface robot 138A is configured to transfer substrates between SRM chambers 120 and SRD chambers 122.

SRM chamber 120 has a first port coupled to the factory interface 102 and a second port coupled to the transfer chamber 101 (e.g., electric plating processing platform). The SRM chamber 120 includes a safeseal chuck and de-chuck device to attach (e.g., assemble) the safeseal to the substrate and/or remove the safeseal from the substrate.

In some embodiments, a safeseal (e.g., SafeSeal™) is an assembly that protects the substrate (e.g., one or more portions of the substrate), sealing the substrate prior to processing the substrate and protecting the substrate throughout operations (e.g., multi-metal plating sequence). Pre-process seal leak testing and post-process cleaning, inspection, and validation allow each substrate to be properly sealed and protected before the plating process begins. The safeseal avoids wafer scrap and tool downtime for seal maintenance or replacement Two substrate transfer robots 104, 105 are disposed in the transfer chamber 101 (e.g., electric plating processing platform) to facilitate transfer of the substrates between process chambers 108, 110, 112, 114, and 120 in transfer chamber 101.

Processing system 100B is in communication with a controller device 190. The controller device 190 is a controller that controls the process parameters of each substrate processing chamber 108, 110, 112, 114, 120, and 122 in processing system 100B. In some embodiments, the controller device 190 provides sequencing and scheduling of the substrates to be processed in the processing system 100B. The controller device 190 causes the substrates to be processed based on takt time 172 and queue times 174 (e.g., schedule 176).

Figure 2A:
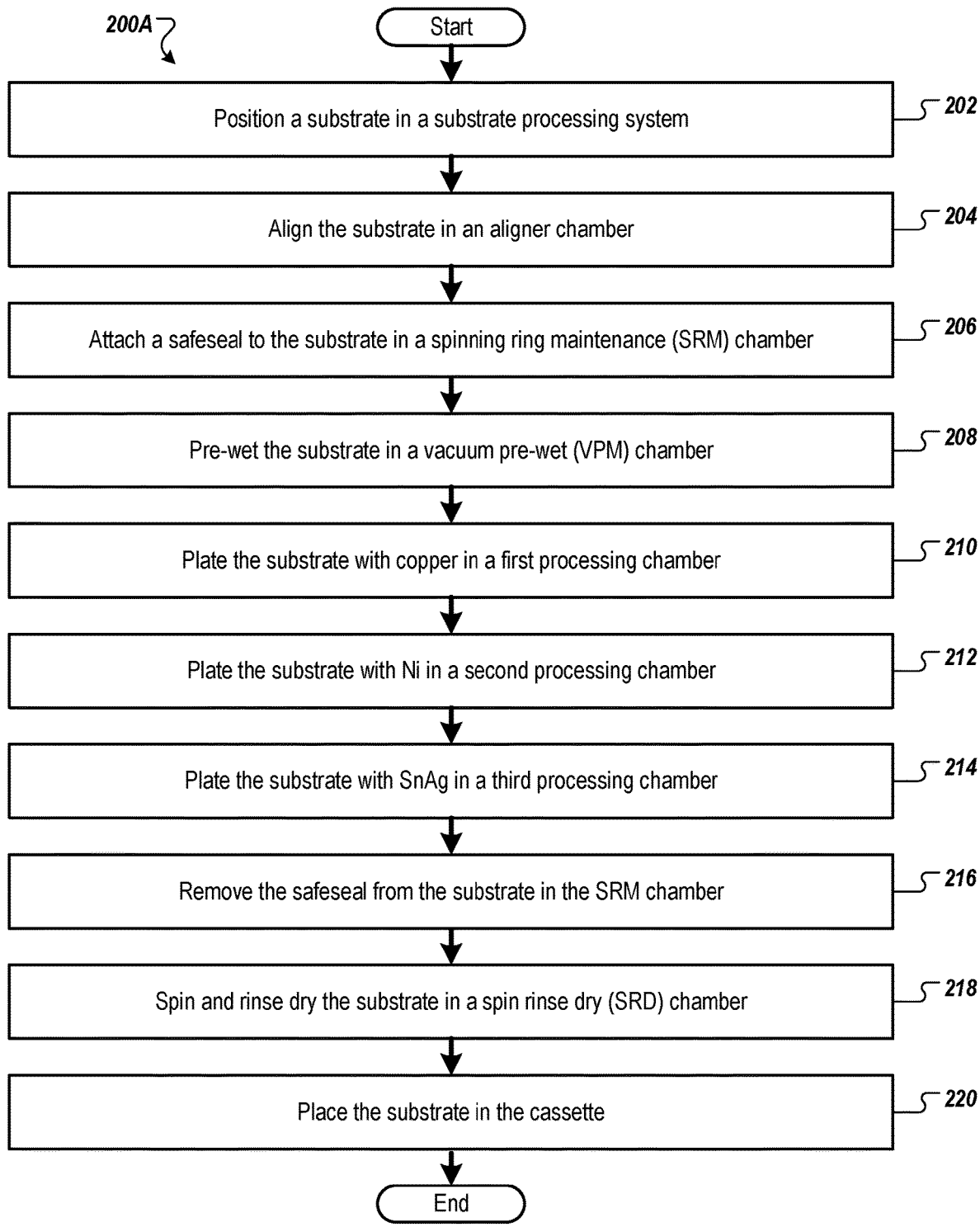
FIGS. 2A-B are flow diagrams of methods associated with scheduling substrate routing and processing, according to certain embodiments.
Figure 2B:
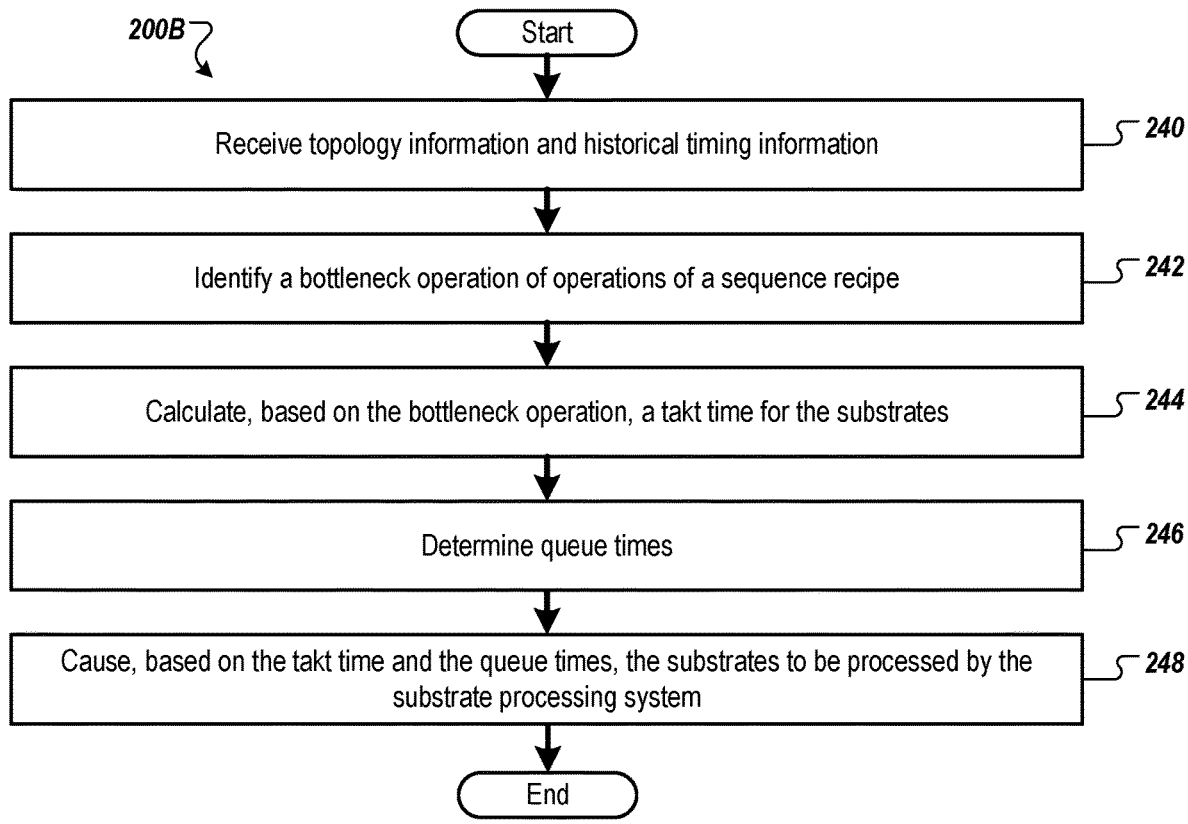

FIGS. 2A-B are flow diagrams of methods 200A-B associated with scheduling substrate routing and processing, according to certain embodiments. Methods 200A-B are performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 200A-B are performed, in part, by controller device 190 (e.g., scheduling component 194). In some embodiments, methods 200A-B are performed, in part, by client device 192 (e.g., scheduling component 194). In some embodiments, a non-transitory storage medium stores instructions that when executed by a processing device (e.g., of controller device 190, client device 192, etc.) cause the processing device to perform one or more of methods 200A-B.

For simplicity of explanation, methods 200A-B are depicted and described as a series of operations. However, operations in accordance with this disclosure can occur in various orders and/or concurrently and with other operations not presented and described herein. Furthermore, in some embodiments, not all illustrated operations are be performed to implement methods 200A-B in accordance with the disclosed subject matter. In addition, those skilled in the art will understand and appreciate that methods 200A-B could alternatively be represented as a series of interrelated states via a state diagram or events.

FIG. 2A is a flow diagram of a method 200A (e.g., process sequence for plating three layers on a substrate) for substrate processing equipment (e.g., an integrated cluster tool, manufacturing equipment 124 of FIG. 1A, processing system 100B of FIG. 1), according to certain embodiments.

At block 202 of method 200A, processing logic positions a substrate in a substrate processing system (e.g., cluster tool). In some embodiments, at block 202, the substrate is positioned in a cluster tool on either FOUP 128A, 128n, or 128C of FIG. 1. In some embodiments, the FOUP 128 housing the substrate is docked on a load port of the substrate processing system.

At block 204, processing logic aligns the substrate in an aligner device (e.g., aligner chamber). In some embodiments, at block 204, the substrate is aligned in the aligner device 129 of FIG. 1B.

At block 206, processing logic attaches a safeseal (e.g., protective assembly, protective covering, etc.) to the substrate in a spinning ring maintenance (SRM) chamber. In some embodiments, at block 206, the substrate is moved to the SRM chambers 120 of FIG. 1B to be chucked in a safeseal.

At block 208, processing logic pre-wets the substrate in a vacuum pre-wet (VPM) chamber. In some embodiments, at block 208, the substrate is pre-wet in the VPM chamber 108 of FIG. 1B.

At block 210, processing logic plates the substrate with copper in a first processing chamber. In some embodiments, at block 210, the substrate is plated with copper in one of the available plating chambers 110 of FIG. 1B.

At block 212, processing logic plates the substrate with nickel (Ni) in a second processing chamber. In some embodiments, at block 212, the substrate is moved to one of the available plating chambers 112 of FIG. 1B to be plated with Ni.

At block 214, processing logic plates the substrate with a tin-silver alloy (SnAg) in a third processing chamber. In some embodiments, at block 214, the substrate is sent to an available plating chamber 114 of FIG. 1B to be plated with SnAg.

At block 216, processing logic removes the safeseal from the substrate in the SRM chamber. In some embodiments, at block 216, the substrate is sent back to the SRM chamber 120 of FIG. 1B to de-chuck the substrate from the safeseal.

At block 218, processing logic spins and rinse dries the substrate in a spin rinse dry (SRD) chamber. In some embodiments, at block 218, the substrate is sent into one of the available SRD chambers 122 of FIG. 1B.

At block 220, processing logic places the substrate in the cassette (e.g., FOUP). In some embodiments, at block 220, after completing the processing operations, the substrate is sent to FOUP 128A, 128B, or 128C.

In some embodiments, takt time and queue times (e.g., a schedule) are determined for the sequence recipe of method 200A and method 200A is performed based on the takt time and queue times (e.g., a schedule) to provide an improved throughput and an improved substrate-to-substrate consistency.

Referring to FIG. 2B, method 200B is associated with processing substrates in a substrate processing system (e.g., cluster tool, manufacturing equipment 184 of FIG. 1A, processing system 100B of FIG. 1B, etc.).

At block 240 of method 200C, processing logic receives topology information and historical timing information. In some embodiments, the processing logic receives the sequence recipe (e.g., operations 152 of sequence recipe 150 of FIG. 1A). In some embodiments, the historical timing information includes historical transfer timings (e.g., average transfer timings over time, average pick-up timings, average drop-off timings, average transportation timings, etc.), historical processing timings (e.g., average processing chamber timings over time), and/or historical cleaning timings (e.g., average cleaning timings over time). In some embodiments, at block 240, a client device (e.g., client device 192 of FIG. 1A) receives inputs (e.g., topology information, historical information, etc.) from the controller (e.g., controller device 190 of FIG. 1A). The input includes topology information of the cluster tool (e.g., topology of processing system 100B of FIG. 1B) that lists the connected robots for each process location with capable robot tasks (e.g., for process location P1L1, the connected robots are PR1 and PR2 which can perform Get/Move/Put tasks). In some embodiments, topology information for processing system 100B of FIG. 1B is illustrated in Table 1.

TABLE 1

| Process Locations | Connected Robot 1 | Connected Robot 2 | Connected Robot 3 | Connected Robot 4 |
|---|---|---|---|---|
| P1L1 | PR1 | PR2 | | |
| P1L2 | PR1 | PR2 | | |
| P1R1 | PR1 | PR2 | | |
| P1R2 | PR1 | PR2 | | |
| P2L1 | PR1 | PR2 | | |
| P2L2 | PR1 | PR2 | | |
| P2R1 | PR1 | PR2 | | |
| P2R2 | PR1 | PR2 | | |

TABLE 1-continued

| Process Locations | Connected Robot 1 | Connected Robot 2 | Connected Robot 3 | Connected Robot 4 |
|---|---|---|---|---|
| P3L1 | PR1 | PR2 | | |
| P3L2 | PR1 | PR2 | | |
| P3R1 | PR1 | PR2 | | |
| P3R2 | PR1 | PR2 | | |
| P4L1 | PR1 | PR2 | | |
| P4L2 | PR1 | PR2 | | |
| P4R1 | PR1 | PR2 | | |
| P4R2 | PR1 | PR2 | | |
| P5L1 | PR1 | PR2 | | |
| P5L2 | PR1 | PR2 | | |
| P5R1 | PR1 | PR2 | | |
| P5R2 | PR1 | PR2 | | |
| S1L3 | PR1 | PR2 | | |
| S1R3 | PR1 | PR2 | | |
| S1L2 | PR1 | PR2 | Fi1 | Fi2 |
| S1R2 | PR1 | PR2 | Fi1 | Fi2 |
| S1L1 | Fi1 | Fi2 | | |
| S1R1 | Fi1 | Fi2 | | |

In some embodiments, the input includes historical transfer timings e.g., robot timing, average timing for each robot task), such as that shown in Table 2.

TABLE 2

| Robot Action | Average (milliseconds (ms)) |
|---|---|
| Fi Get | 25000 |
| Fi Move | 3000 |
| Fi Put | 4000 |
| PR Get | 3600 |
| PR Move | 5000 |
| PR Put | 2400 |

In some embodiments, the input includes a sequence for substrates (e.g., historical operation timings, sequence recipe, processing operations, configured process sequence for method 200A of FIG. 2A), such as that shown in Table 3.

In Table 3, the odd operations are robot operations in which Table 3 lists the assigned robot for transferring a substrate from the previous operation to the next operation.

TABLE 3

| FIG. 2A Index | Operation | Type | Destination Locations (FIG. 1B chamber index) | Number of Modules | Process recipe Time (ms) | Clean Recipe Time (ms) | Queue Time (ms) |
|---|---|---|---|---|---|---|---|
| | 1 | Robot | Fi2 | 1 | | | |
| 204 | 2 | Chamber | AL (129) | 1 | 3107 | | 0 |
| | 3 | Robot | Fi2 | 1 | | | |
| 206 | 4 | Chamber | S1L2, S1R2 (120) | 2 | 16609 | | 0 |
| | 5 | Robot | PR1 | 1 | | | |
| 208 | 6 | Chamber | S1L3, S1R3 (108) | 2 | 158283 | | 0 |
| | 7 | Robot | PR2 | 1 | | | |
| 210 | 8 | Chamber | P1R2, P2R1, P2R2, P3R1, P3R2, P4R1, P4R2, P5R2 (110) | 8 | 955595 | | 0 |
| | 9 | Robot | PR1 | 1 | | | |
| 212 | 10 | Chamber | P4L1, P4L2, P5L1, P5L2 (112) | 4 | 509578 | | 0 |
| | 11 | Robot | PR2 | 1 | | | |

TABLE 3-continued

| FIG. 2A Index | Operation | Type | Destination Locations (FIG. 1B chamber index) | Number of Modules | Process recipe Time (ms) | Clean Recipe Time (ms) | Queue Time (ms) |
|---|---|---|---|---|---|---|---|
| 214 | 12 | Chamber | P1L1, P2L1, P2L2, P3L1, P3L2 (114) | 5 | 782201 | | 0 |
| | 13 | Robot | PR1 | 1 | | | |
| 216 | 14 | Chamber | S1L2, S1R2 (120) | 2 | 0 | 39739 | 0 |
| | 15 | Robot | Fi1 | 1 | | | |
| 218 | 16 | Chamber | S1L21 S1R1 (122) | 2 | 48724 | | 0 |
| | 17 | Robot | Fi2 | 1 | | | |

The operation 0 is not listed because operation 0 is a cassette (e.g., FOUP) at the load port, such as FOUP 128A, 128B, or 128C in FIG. 1B. The last operation is also a robot operation. Operation 17 is transferring a substrate from chamber in operation 16 (e.g., chamber 122 of FIG. 1B) to a cassette (FOUP 128A, 128B, or 128C in FIG. 1B). The even operations are processing operations (e.g., chamber operations). The processing operations list a set of process chambers that are configured to perform the process for that processing operation. The number of processing chambers, the process recipe time and the clean recipe time are listed.

The sequence recipe has a list of operations. The odd number of operations is to robot locations, where the first operation is the robot operation that picks up a substrate from the cassette docked at the load port. Even number of operations are to chamber locations. Sequence operation s is start time ($S_s$) (time stamp when the sequence operation s is started). For a robot sequence operation, $S_s$ is the timestamp when robot starts picking the substrate from the previous location. For a chamber operation, $S_s$ is the timestamp when the process recipe (e.g., processing operation in the processing chamber) is started. The process recipe duration for sequence operation s is $P_s$. Queue time for operation s is $Q_s$ and is the duration for substrate staying in chamber for sequence operation s after process recipe is completed. Clean recipe duration for sequence operation s is $C_s$. Sequence operation s end time is $E_s$ (e.g., timestamp when the sequence operation is ended). For a robot sequence operation $E_s$ is the timestamp when the robot finishes picking substrate from the previous operation to the robot location, move to the location for the next sequence operation, put to empty location in next operation, or swap with the substrate in the next operation. For the chamber operation, $E_s$ is the timestamp when the process recipe and queue time for that operation are completed.

The first batch of substrates (e.g., substrates in a first FOUP 128 of FIG. 1B) is defined as ($W_i$) where i ranges from 1 to W (e.g. 1 to 100). For the example discussed in Table 3, each substrate $W_i$ undergoes the same sequence of operations (e.g., method 200A of FIG. 2A). The operations in the sequence are represented mathematically as ($S_i$) where i ranges from 1 to S. (e.g., 1 to 17 in Table 3). Each substrate $W_i$ undergoes each operation $S_i$ in the sequence defined in block 240. In some embodiments, at block 242, processing logic (e.g., of client device 192) analyzes the sequence for substrates and identify the bottleneck operation of the substrate processing flow.

The substrate processing system (e.g., cluster tool) is modeled as a black Block, where substrates (products) sitting in cassettes that are docked in the load ports are sent into the black Block to get processed and then return to the cassettes. One substrate is sent into the black Block every takt time, so that the substrate processing flow is established every takt time. Responsive to the first substrate being sent into the cluster tool at time 0, the second substrate is sent into the cluster tool at 1*Takt time, the third substrate is sent into the cluster tool at 2*Takt time, and so forth unit $W^{th}$ substrate is sent into the cluster at (W−1)*Takt time. A substrate is picked up from the cassette every takt time.

There are substrates 1 to W located in the cassettes docked at the load ports. Each substrate has a N operations sequence, where N is an odd number (e.g., the first operation is a robot operation that picks up a substrate from the load port, the next operation is a chamber operation, and there is a robot operation in between chamber operations to move the substrate from the previous chamber operation to the next chamber operation. The robot actions are modeled as picking a substrate from the location of the previous operation, moving to the location in the next operation, and then dropping the substrate to the next operation. The term "get" is used for "picking up," the term "move" is used for "moving," and the term "put" is used for "dropping off." The last operation is the robot operation to put the substrate back to the load port (e.g., in a cassette). Table 3 shows an example of the N operations sequence.

The processing logic is to determine the takt time that controls the time interval to feed the substrate processing system and the processing logic is to add artificial delay of queue time $Q_{2k}$ (k=1, 2, . . . , N/2) to adjust the robot picking time for even sequence operations to make robot tasks not conflict with each other (e.g., be non-conflict). The starting timing of robot tasks and process tasks are then generated (e.g., based on the queue time and/or takt time) for the substrates.

The substrate i sequence operation 1 starting time is: $S_{1i}$=(i−1)Takt.

The substrate i sequence operation s starting time for odd sequence operations (robot operation), where s=1, 3, 5, . . . , N, is as follows:

$$S_{si} = (i-1)Takt + \sum_{k=1}^{\frac{s}{2}} (T_{get(2k-2,2k-1)} + T_{move(2k-2,2k)} + T_{put(2k-1,2k)} + P_{2k} + Q_{2k}). \quad \text{(Equation 1)}$$

For example, for operation 3, substrate i start time is:

$$S_{3i} = (i-1)Takt + \sum_{k=1}^{\frac{3}{2}} (T_{get(2k-2,2k-1)} + T_{move(2k-2,2k)} + T_{put(2k-1,2k)} + P_{2k} + Q_{2k})$$

$$S_{3i} = (i-1)Takt + T_{get(0,1)} + T_{move(0,2)} + T_{put(1,2)} + P_2 + Q_2$$

$T_{get(0,1)}$ is the time duration for picking a substrate from operation 0 location (cassette) to the operation 1 location (robot). $T_{move(0,2)}$ is the time duration for moving the robot from operation 0 location (cassette) to operation 2 location. $T_{put(1,2)}$ is the time duration for the robot to drop the substrate to the operation 2 location (the substrate is already on the operation 1 location: robot). $P_2$ is the process recipe time for operation 2. $Q_2$ is the Q time for operation 2.

In another example, for operation 5, substrate i start time is:

$$S_{5i} = (i-1)Takt + \sum_{k=1}^{\frac{5}{2}} (T_{get(2k-2,2k-1)} + T_{move(2k-2,2k)} + T_{put(2k-1,2k)} + P_{2k} + Q_{2k})$$

$$S_{5i} = (i-1)Takt + T_{get(0,1)} + T_{move(0,2)} + T_{put(1,2)} + P_2 + Q_2 + T_{get(2,3)} + T_{move(2,4)} + T_{put(3,4)} + P_4 + Q_4$$

$T_{get(0,1)}$ is the time duration for picking a substrate from operation 0 location (cassette) to the operation 1 location (robot). $T_{move(0,2)}$ is the time duration for moving the robot from operation 0 location (cassette) to operation 2 location. $T_{put(1,2)}$ is the time duration for the robot to drop the substrate to the operation 2 location (the substrate is already on the operation 1 location: robot). $P_2$ is the process recipe time for operation 2. $Q_2$ is the Q time for operation 2. $T_{get(2,3)}$ is the time duration for picking a substrate from operation 2 location to the operation 3 location (robot). $T_{move(2,4)}$ is the time duration for moving the robot from operation 2 location to operation 4 location. $T_{put(3,4)}$ is the time duration for the robot to drop the substrate to the operation 4 location (the substrate is already on the operation 3 location: robot). $P_4$ is the process recipe time for operation 4. $Q_4$ is the Q time for operation 4.

The substrate i sequence operation s starting time for even sequence operations (chamber operation), where s=2, 4, 6, . . . , N-1, is as follows:

$$S_{si} = (i-1)Takt + \sum_{k=1}^{\frac{s}{2}-1} (T_{get(2k-2,2k-1)} + T_{move(2k-2,2k)} + T_{put(2k-1,2k)} + P_{2k} + Q_{2k}) + T_{get(s-2,s-1)} + T_{move(s-2,s)} + T_{put(s-1,s)}. \quad \text{(Equation 2)}$$

For example, for operation 4, substrate i start time is as follows:

$$S_{4i} = (i-1)Takt + \sum_{k=1}^{\frac{4}{2}-1} (T_{get(2k-2,2k-1)} + T_{move(2k-2,2k)} + T_{put(2k-1,2k)} +$$

$$P_{2k} + Q_{2k}) + T_{get(4-2,4-1)} + T_{move(4-2,4)} + T_{put(4-1,4)}$$

$$S_{4i} = (i-1)Takt + T_{get(0,1)} + T_{move(0,2)} + T_{put(1,2)} + P_2 + Q_2 + T_{get(2,3)} + T_{move(2,4)} + T_{put(3,4)}$$

In another example, for operation 6, substrate i start time is as follows:

$$S_{6i} = (i-1)Takt + \sum_{k=1}^{\frac{6}{2}-1} (T_{get(2k-2,2k-1)} + T_{move(2k-2,2k)} + T_{put(2k-1,2k)} + P_{2k} + Q_{2k}) + T_{get(6-2,6-1)} + T_{move(6-2,6)} + T_{put(6-1,6)}$$

$$S_{6i} = (i-1)Takt + T_{get(0,1)} + T_{move(0,2)} + T_{put(1,2)} + P_2 + Q_2 + T_{get(2,3)} + T_{move(2,4)} + T_{put(3,4)} + P_4 + Q_4 + T_{get(4,5)} + T_{move(4,6)} + T_{put(5,6)}$$

At block 242, processing logic identifies a bottleneck operation of operations of a sequence recipe and at block 244, the processing logic determines, based on the bottleneck operation, a takt time for the substrates (e.g., the same takt time for all of the substrates).

In some embodiments, the processing logic identifies multiple bottleneck operations. In some embodiments, the one or more bottleneck operations are from one or more of the following areas: process bound; robot bond; and/or revisit bound. Process bound is the boundary defined by the process duration and the number of chambers. Robot bound is the boundary defined by the total transfer duration for each robot. Revisit bound is the boundary defined by the total duration of the process and the transfer duration of the revisiting sub-sequence operations (e.g., sub-sequences of the revisiting operation).

In some embodiments, processing logic identifies the bottleneck operation of an N operations sequence (N is an odd number): Sequence={$S_1, S_2, \ldots S_N$}. $S_s$ stands for a sequence operation. $S_1, S_3, S_5, \ldots S_N$ are the robot operations. $S_2, S_4, \ldots S_{N-1}$ are the chamber operations. Chamber $S_s$={$N_s, P_s, 1 \times C_s, Q_s$}, where $N_s$ is the number of chambers dedicate to the operation s, $P_s$ is process recipe time, $C_x$ is 1× clean recipe time, and $Q_s$ is the algorithm added artificial delaying time (e.g., queue time) for the operation s to adjust the robot picking time for $S_s$. $Q_i$ is set to 0 for i=2, 4, . . . N-1.

The takt time is calculated for each sequence chamber operation i=2, 4, . . . N-1 for identifying the process-bound using the following:

$$Takt_s = \frac{P_s + Q_s + C_s + T_{ex}}{Ns}$$

$T_{ex}$ is the time for substrate exchange. $T_{ex}$ is the time to remove the current processed substrate from the chamber and feed the next substrate to the same chamber. $T_{ex}$ is different based on the situation of robot that is serving the chamber.

If "destination locations" for $S_{i-1}$ and $S_{i+1}$ are the same and the "destination locations" for $S_{i-1}$ and $S_{i+1}$ are a single location, then a single robot serves the chamber. The robot: gets the substrate from the chamber to the blade (e.g., of the single robot); moves the blade with the substrate to the chamber of the next sequence operation; puts the substrate from the blade to the chamber of the next operation; moves the empty blade to the chamber of the previous sequence operation; gets the next substrate from chamber of the previous sequence operation; moves the blade with next substrate to the current chamber; puts the next substrate from blade to the current chamber. For an example, see operation 2 of Table 3. The time for substrate exchange is as follows:

$$T_{ex}=(T_{get}+T_{move}+T_{put})+T_{move}+(T_{get}+T_{move}+T_{put})$$

If "destination locations" for $S_{i-1}$ and $S_{i+1}$ are not same and the "destination locations" are two slot locations of a same robot, then a dual blade robot serves the chamber. While the next substrate from the chamber of a previous sequence operation is placed on one of the robot blades, the other robot blade remains empty and is oriented towards the current chamber. Once the current substrate is ready to move out, the robot is to: get a current substrate from the chamber to the empty robot blade; and put the next substrate from the other robot blade to the chamber. For example, see operations 6, 8, 10, and 12 of Table 3. The time for substrate exchange is as follows:

$$T_{ex}=T_{get}+T_{put}$$

If "destination locations" for $S_{i-1}$ and $S_{i+1}$ are not same and the "destination locations" for $S_{i-1}$ and $S_{i+1}$ belong to two different robots, two different single blade robots serve the chamber. Once the substrate in current chamber is ready to move out: the robot specified in $S_{i+1}$ gets the substrate from the current chamber to that robot blade; and the robot specified in $S_{i-1}$ puts the substrate from that robot blade to the current chamber. For example, see operations 4, 14, and 16. The time for substrate exchange is as follows:

$$T_{ex}=T_{get}+T_{put}$$

For the example of Table 3, the takt time for chamber operations are:

Takt$_2$=27107 ms;
Takt$_4$=12104 ms;
Takt$_6$=82141 ms;
Takt$_8$=120199 ms;
Takt$_{10}$=128894 ms;
Takt$_{12}$=157640 ms;
Takt$_{14}$=23569 ms; and
Takt$_{16}$=36362 ms.

The robot takt time is calculated for each robot for identifying the robot-bound. Robot r is associated with operations $\{s_1, s_2, \ldots s_n\}$. The robot Takt$_r=\Sigma_{k=1}^n=(T_{get(Sk-1,Sk)}+T_{move(Sk-1,Sk+1)}+T_{put(Sk,Sk+1)})$. For the above sequence example in Table 3, the following is calculated:

Takt$_{FI2}$=T(0,2)+T(2,4)+T(16,18)

$T(0,2)=T_{get}+T_{move}+T_{put}$ $T(2,4)=T_{get}+T_{move}+T_{put}$ $T(16,18)=T_{get}+T_{move}+T_{put}$ Takt$_{FI2}$=3*(5000+3000+4000)=36000 ms Takt$_{FI1}$=T(14,16)

Takt$_{FI1}$=T(14,16)=$T_{get}+T_{move}+T_{put}$=12000 ms

Takt$_{PR}$=T(4,6)+T(6,8)+T(8,10)+T(10,12)+T(12,14)

$T(4,6)=T_{get}+T_{move}+T_{put}$ $T(6,8)=T_{get}+T_{move}+T_{put}$ $T(8,10)=T_{get}+T_{move}+T_{put}$ $T(10,12)=T_{get}+T_{move}+T_{put}$ $T(12,14)=T_{get}+T_{move}+T_{put}$ Takt$_{PR}$=5*(3600+5000+2400)=55000 ms The takt time is calculated for revisit sequence operations for identifying revisit bound. From sequence operation X to operation Y (chamber operations), there is one revisit loop. The same robot is used for these operations.

For $S_x$ ($N_x$, $P_x$, $Q_x$, $C_x$), $S_{x+1}$ (robot), $S_{x+2}$ ($N_{x+2}$, $P_{x+2}$, $Q_{x+2}$, $C_{x+2}$), ..., $S_y$ ($N_y$, $P_y$, $Q_y$, $C_y$), the modules for $S_x$ and $S_y$ are identical ($S_x$ to $S_y$ forms one loop). The takt time is calculated as follows:

Revisit-takt=Max(($T_{put}+P_x+Q_x+C_x+T_{get})/N_x+T_{move}+(Y-X)/2*(T_{get}+T_{put}+T_{move})+(T_{put}+P_y+Q_y+C_y+T_{get})/N_y$,Max(($P_i+C_i+Q_i+T_{get}+T_{put})/N_i)_{(i=even\ \#\ in\ x+1\ to\ Y-1)}$)

The revisit loop is modeled as $S_x$, $S_{x+1\ to\ y-1}$, $S_y$, where $S_x$ and $S_y$ form a circle (e.g., loop), and $S_{x+1\ to\ y-1}$ are the non-revisit operations in between $S_x$ and $S_y$.

The takt time for the revisit loop is the maximum between the following:

$(T_{put}+P_x+Q_x+C_x+T_{get})/N_x+T_{move}+(Y-X)/2*(T_{get}+T_{put}+T_{move})+(T_{put}+P_y+Q_y+C_y+T_{get})/N_y$ The revisit loop has three consecutive segments:

$S_x: (T_{put}+P_x+Q_x+C_x+T_{get})/N_x$;

Move one substrate from $S_x$ to $S_y$: $T_{move}+(Y-X)/2*(T_{get}+T_{put}+T_{move})$; and $S_y: (T_{put}+P_y+Q_y+C_y+T_{get})/N_y$.

The process bound for the non-revisiting chamber operations between x and y is shown as:

Max(($P_i+C_i+Q_i+T_{get}+T_{put})/N_i)_{(i=even\ \#\ in\ x+1\ to\ Y-1)}$

For the example in Table 3, operation 4 to operation 14 forms a revisit loop. The sequence flow is modeled as: $\{S_1, S_2, S_3, S_{4\ to\ 14}, S_{15}, S_{16}, S_{17}\}$. The takt time from operation 4 to 14 is shown as:

Takt$_{4\ to\ 14}$=Max(($T_{put}+P_4+Q_4+C_4+T_{get})/N_4+T_{move}+(14-4)/2*(T_{get}+T_{put}+T_{move})+(T_{put}+P_{14}+Q_{14}+C_{14}+T_{get})/N_{14}$,Max(($P_i+C_i+Q_i+T_{get}+T_{put})/N_i)_{(i=even\ \#\ in\ 5\ to\ 13)}$)

Takt$_{4\ to\ 14}$=Max(Takt$_4+T_{move}+(14-4)/2*(T_{get}+T_{put}+T_{move})+$Takt$_{14}$,Max(Takt$_6$,Takt$_8$,Takt$_{10}$,Takt$_{12}$))

Takt$_{4\ to\ 14}$=Max(12104+5*(11000)+23569,Max(82141,120199,128894,157640))

Takt$_{4\ to\ 14}$=Max (90673, 157640)=157640 (ms). If the Takt$_4$ or Takt$_{14}$ is greater, the bottleneck operation is shifted to the revisiting loop. Now the Takt$_{12}$ is still the bottleneck operation (process bound from operation 12) for the revisit sequence operations 4 to 14.

The final takt time is calculated for the converted sequence flow $\{S_1, S_2, S_3, S_{4\ to\ 14}, S_{15}, S_{16}, S_{17}\}$ as follows:

Takt=Max(Takt$_2$,Takt$_{4\ to\ 14}$,Takt$_{16}$,Takt$_{FI2}$,Takt$_{FI1}$)

Takt=Max(27107,157640,36362,36000,12000)=157640 ms

Operation 12 of Takt$_{12}$=157640 ms is identified as the bottleneck operation for the substrate sequence flow defined in Table 3. Responsive to identifying operation 12 of $Takt_{12}=157640$ ms as the bottleneck operation, the takt time of 157640 ms is used for the method 200A of FIG. 2A.

At block 246, processing logic determines queue times. In some embodiments, to determine queue times, the processing logic (e.g., of client device 192 of FIG. 1A) models a planned delay $Q_i$ (e.g., queue time) to satisfy the following conditions: for the even sequence operations, force the robot swap for the chamber operations that has dual robot assignment and expects wafer exchange time as the time of swap; resolve the robot conflicts for the chamber operations with single robot assignment; and determine the delay is not added to the one or more bottleneck operations.

To determine the queue times, constraints (e.g., sequence recipe constraints) are created (e.g., by the processing logic) for even numbers of sequence operation $Q_i$, i=2, 4, ..., N/2, $0 <= Q_i <= Takt*N_i - (P_i+C_i+T_{ex})$ (i.e. for bottleneck operation, the $Q_i$ is to be zero, the non-bottleneck operations, $Q_i$ has a range). The $T_{ex}$ is the wafer exchange time that follows the description in block 242-244.

Each chamber sequence operation (even operations) is scanned (e.g., by the processing logic) if the operation has swappable robot assignment and 0 clean recipe time, such as operation 6, operation 5 is PR1 and operation 7 is PR2 which indicates that PR2 is picking up a wafer from operation 6 and PR1 is dropping off the next wafer to operation 6. Therefore, for operation 6, it has a swappable robot assignment. Operation 8, 10, and 12 has the swappable robot as well. Assume operation x has a swappable robot, operation x has $N_x$ chambers, and the x+1 substrate is sent from operation x-1 to operation x to swap with the substrate 1. The $Q_x$ is to satisfy $Q_x=N_x*Takt-P_x-(T_{get}+T_{put})$. All Q variable are determined for these operations.

For each single blade robot, a set of service time constraints is assigned, the initial value being empty. For the robot service set: $RS_x=\{\}$ (x=1, 2, ... number of robots). For each even operation of the sequence with single robot assignment, the equation of robot stat picking time is as follows:

$$S_{xi} = ((x-1)Takt + \sum_{k=1}^{\frac{i}{2}}(T_{get(2k-2,2k-1)} + T_{move(2k-2,2k)} + T_{put(2k-1,2k)} + P_{2k} + Q_{2k}))$$

This is modeled by takt time to have relative robot picking time and robot end time for operation I as follows:

$$S_r[i] = \sum_{k=1}^{\frac{i}{2}}(T_{get(2k-2,2k-1)} + T_{move(2k-2,2k)} + T_{put(2k-1,2k)} + P_{2k} + Q_{2k}) \bmod Takt$$

The corresponding robot y is determined as being responsible for picking up the substrate from operation i and for moving the substrate to operation i+2, (it is the robot specified in operation i+1), the $S_r[i]$ is appended to the $RS_y$. Each element of the set $RS_i$ is checked that has two or more items. For any combination of two items in the same set (i.e., operation x and operation y), $S_r[x]$ and $S_r[y]$ have no overlap for the service period. The maximum number of conditions to check is $$\binom{size\ of\ RSi}{2}.$$

For the example in Table 3, the following are the results after generating math constraints with Q variables for each sequence process operation.

Constraints (e.g., sequence recipe constraints) are created so that each $Q_i$ has a range so that after adding $Q_i$, the bottleneck operation is not worse (i.e., $0<=Q_i<=Takt*N_i-(P_i+C_i+T_{ex})$). The Takt, $N_i$, $P_i$, $C_i$, and $T_{ex}$ are known for each operation, so the range for the $Q_i$ is then calculated as follows:

$0<=Q_2<=130533$ ms;

$0<=Q_4<=291071$ ms;

$0<=Q_6<=150997$ ms;

$0<=Q_8<=299526$ ms;

$0<=Q_{10}<=114928$ ms;

$0<=Q_{12}<=0$ ms(bottleneck operation);

$0<=Q_{14}<=268141$ ms; and $0<=Q_{16}<=315280$ ms.

For enforcing the robot swap for the swappable chamber operations, the queue variables (Qs) are resolved for swappable operations 6, 8, 10, and 12 as $Q_i=N_x*Takt-P_x-(T_{get}+T_{put})$, where:
Q6=150997 ms;
Q8=299527 ms;
Q10=114983 ms; and
Q12=0 m (because $S_{12}$ is the bottleneck).

The single blade robot Fi1 and Fi2 (e.g., factory interface robots) are being used in the following sequence operations: Fi1 for operation 14; and Fi2 for operation 0 (picking from cassette in load port), operation 2, and operation 16.

Eight queue variables are to be solved: $Q_2$, $Q_4$, $Q_6$, $Q_8$, $Q_{10}$, $Q_{12}$, $Q_{14}$, and $Q_{16}$. $Q_6$, $Q_8$, $Q_{10}$, and $Q_{12}$ are solved after enforcing the robot swap for operations 6, 8, 10, and 12. For the remaining, $Q_2$, $Q_4$, $Q_{14}$, and $Q_{16}$, since $Q_{14}$ is for robot Fi1 and Fi1 has one operation associated with it, there is robot conflict for Fi1. Fi2 has three chamber operations to service (i.e., operations 0, 2, and 16), so for Fi2, there are 3 elements in the RS (robot service set). Since there is no Q variable for operation 0, $Q_2$ and $Q_{16}$ are to be solved to not have overlap for elements in the robot service set for Fi2. The RS set for Fi2 has 3 elements: ($S_r[1]$, $S_r[3]$, $S_r[17]$). Math inequalities are created so that there is no overlap between the service period of any two of these elements.

For ($S_r[1]$, $S_r[3]$), the math inequalities are:

$ABS(S_r[1]-S_r[3])>T_{get(0,1)}+T_{move(0,2)}+T_{put(1,2)}$; and $ABS(S_r[3]-S_r[1])>T_{get(2,3)}+T_{move(2,4)}+T_{put(3,4)}$.

For ($S_r[1]$, $S_r[17]$), the math inequalities are:

$ABS(S_r[1]-S_r[17])>T_{get(0,1)}+T_{move(0,2)}+T_{put(1,2)}$; and $ABS(S_r[17]-S_r[1])>T_{get(16,17)}+T_{move(16,18)}+T_{put(17,18)}$.

For ($S_r[3]$, $S_r[17]$), the math inequalities are:

$ABS(S_r[3]-S_r[17]) > T_{get(2,3)} + T_{move(2,4)} + T_{put(3,4)}$; and $ABS(S_r[17]-S_r[3]) > T_{get(16,17)} + T_{move(16,18)} + T_{put(17,18)}$.

In some embodiments, the processing logic (e.g., of client device 192 of FIG. 1A) calls a solver (e.g., linear programming (LP) solver, linear optimization solver) to find the optimized values for the Q variables in the inequalities. The following is to be examined:

$$\binom{N/2}{2}.$$

Two inequalities are created per combination. There are to be a total N/2*(N/2−1) inequalities with N/2 Q variables. For the example in Table 3, there are 6 inequalities with 2 Q variables to solve, which allows for the total computing time in solver (e.g., LP solver) to be limited. In some embodiments, different types of solvers (e.g., linear optimization solver) can be used to solve the Q variables to prevent overlap between any two robot service periods. The solver (e.g., LP solver) returns the answer for $Q_2=0$, $Q_{16}=25307$.

Figure 3:
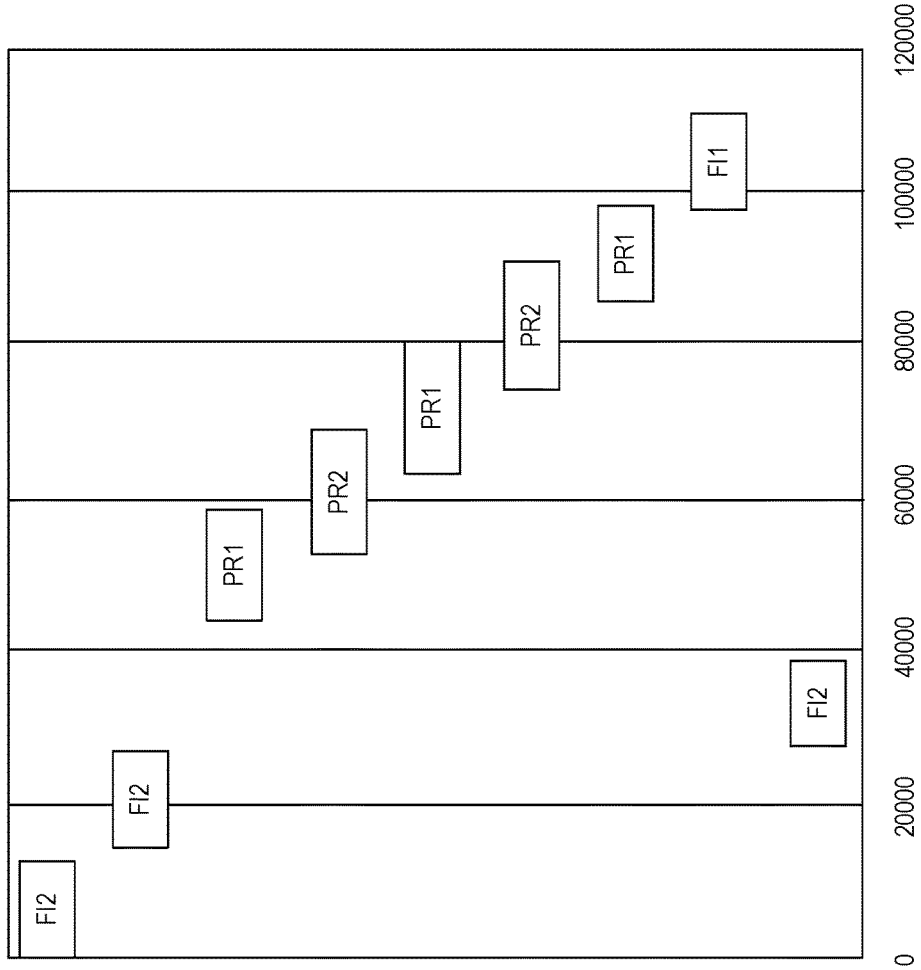
FIG. 3 illustrates a sequence chart, according to certain embodiments.

FIG. 3 illustrates the sequence chart 300 with solved Q variables for the example in Table 3. FIG. 3 also shows robot tasks within one takt period. FIG. 3 shows that there is no overlap between 3 Fi2 tasks, and the tasks for PR1 and PR2 are being connected to form a swapping chain for the swappable chamber operations.

At block 248, processing logic causes, based on the takt time and the queue times, the substrates to be processed by the substrate processing system. In some embodiments, the processing logic (e.g., of client device 192) generates a schedule (e.g., timetable) for W substrates based on the takt time and queue values (Q values) for each sequence operation. For substrate i=1, 2, . . . , W with N sequence operations, the start time for each robot task or process task is calculated. Odd sequence operations (robot operation), s=1, 3, 5, . . . , N are illustrated as follows:

$$S_{si} = (i-1)Takt + \sum_{k=1}^{\frac{s}{2}} (T_{get(2k-2,2k-1)} + T_{move(2k-2,2k)} + T_{put(2k-1,2k)} + P_{2k} + Q_{2k}). \quad \text{(Equation 1)}$$

Even sequence operations (chamber operation), s=2, 4, 6, . . . , N−1 are illustrated as follows:

$$S_{si} = (i-1)Takt + \sum_{k=1}^{\frac{s}{2}-1} (T_{get(2k-2,2k-1)} + T_{move(2k-2,2k)} + T_{put(2k-1,2k)} + P_{2k} + Q_{2k}) + T_{get(s-2,s-1)} + T_{move(s-2,s)} + T_{put(s-1,s)}. \quad \text{(Equation 2)}$$

In some embodiments, a sort operation is calculated and is applied after "start times" for robot and chamber process tasks are determined. The sorted task table is the schedule (e.g., timetable).

In some embodiments, to cause the substrates to be processed, the processing logic transmits the schedule (e.g., timetable, takt time and queue times) to the controller (e.g., controller device 190 of FIGS. 1A-B) and the controller begins substrate processing based on the schedule.

In some embodiments, the topology information, historical timing information, and/or sequence recipe changes over time. In some examples, one or more components are added to and/or removed from the substrate processing system which changes the topology information. In some embodiments, one or more transfer operations, processing operations, and/or cleaning operations become faster or slower over time which changes the historical timing information. In some embodiments, method 200B of FIG. 2B is repeated with updated topology information, updated historical timing information, and/or updated sequence recipe to generate one or more of an updated takt time, one or more updated queue times, and/or an updated schedule for processing substrates in the substrate processing system.

FIG. 3 is a sequence chart 300, according to certain embodiments. The sequence chart 300 includes solved Q variables for the example in Table 3.

Tables 4A-C is an update of Table 3 showing queue times (Tables 4B-C are a continuation of Table 4A) determined by method 200B of FIG. 2B.

TABLE 4A

| FIG. 2A Index | Operation | Type | Destination Locations (FIG. 1B chamber index) | Number of Modules | Process recipe Time (ms) | Clean Recipe Time (ms) | Queue Time (ms) |
|---|---|---|---|---|---|---|---|
|  | 1 | Robot | FI2 | 1 |  |  |  |
| 204 | 2 | Chamber | AL (129) | 1 | 3107 |  | 0 |
|  | 3 | Robot | FI2 | 1 |  |  |  |
| 206 | 4 | Chamber | S1L2, S1R2 (120) | 2 | 16609 |  | 0 |
|  | 5 | Robot | PR1 | 1 |  |  |  |
| 208 | 6 | Chamber | S1L3, S1R3 (108) | 2 | 158283 |  | 150997 |
|  | 7 | Robot | PR2 | 1 |  |  |  |
| 210 | 8 | Chamber | P1R2, P2R1, P2R2, P3R1, P3R2, P4R1, P4R2, P5R2 (110) | 8 | 955595 |  | 299527 |
|  | 9 | Robot | PR1 | 1 |  |  |  |

TABLE 4A-continued

| FIG. 2A Index | Operation | Type | Destination Locations (FIG. 1B chamber index) | Number of Modules | Process recipe Time (ms) | Clean Recipe Time (ms) | Queue Time (ms) |
|---|---|---|---|---|---|---|---|
| 212 | 10 | Chamber | P4L1, P4L2, P5L1, P5L2 (112) | 4 | 509578 | | 114983 |
| | 11 | Robot | PR2 | 1 | | | |
| 214 | 12 | Chamber | P1L1, P2L1, P2L2, P3L1, P3L2 (114) | 5 | 782201 | | 0 |
| | 13 | Robot | PR1 | 1 | | | |
| 216 | 14 | Chamber | S1L2, S1R2 (120) | 2 | 0 | 39739 | 0 |
| | 15 | Robot | FI1 | 1 | | | |
| 218 | 16 | Chamber | S1L21 S1R1 (122) | 2 | 48724 | | 25307 |
| | 17 | Robot | FI2 | 1 | | | |

TABLE 4B

| FIG. 2A Index | Operation | $S_s$ | $E_s$ | Chamber Takt | Chamber Takt Adj | Revisit Takt | Overall Takt |
|---|---|---|---|---|---|---|---|
| | 1 | 0 | 12000 | | | | 157640 |
| 204 | 2 | 12000 | 15107 | 27107 | 27104 | | |
| | 3 | 15107 | 27107 | | | | |
| 206 | 4 | 27107 | 43716 | 12104.5 | 12005 | 157640 | |
| | 5 | 43716 | 58316 | | | | |
| 208 | 6 | 58316 | 367596.4 | 82141.5 | 157640 | | |
| | 7 | 367596.4 | 384596.4 | | | | |
| 210 | 8 | 384596.4 | 1656718 | 120199.4 | 157640 | | |
| | 9 | 1656718 | 1656718 | | | | |
| 212 | 10 | 1656718 | 2281279 | 128894.5 | 157640 | | |
| | 11 | 2281279 | 2298279 | | | | |
| 214 | 12 | 2298279 | 3080480 | 157640.2 | 157640 | | |
| | 13 | 3080480 | 3093880 | | | | |
| 216 | 14 | 3093880 | 3093880 | 23569.5 | 3700 | | |
| | 15 | 3093880 | 3105880 | | | | |
| 218 | 16 | 3105880 | 317991 | | 39016 | | |
| | 17 | 317991 | 3191911 | | | | |

TABLE 4C

| FIG. 2A Index | Operation | Robot | Rel Start | Rel End | Period |
|---|---|---|---|---|---|
| | 1 | FI2 | 0 | 12000 | 12000 |
| 204 | 2 | | | | |
| | 3 | FI2 | 15107 | 27107 | 12000 |
| 206 | 4 | | | | |
| | 5 | PR1 | 43716 | 58316 | 14600 |
| 208 | 6 | | | | |
| | 7 | PR2 | 52316 | 69316 | 17000 |
| 210 | 8 | | | | |
| | 9 | PR1 | 63316 | 80316 | 17000 |
| 212 | 10 | | | | |
| | 11 | PR2 | 74316 | 91316 | 17000 |
| 214 | 12 | | | | |
| | 13 | PR1 | 85316 | 98716 | 13400 |
| 216 | 14 | | | | |
| | 15 | FI1 | 98716 | 110716 | 12000 |
| 218 | 16 | | | | |
| | 17 | FI2 | 17107 | 39107 | 12000 |

As shown in FIG. 3, the sequence chart 300 illustrates when different robots start and end in Table 4C. By causing operations (e.g., processing, transport, cleaning, etc.) of a sequence recipe to be performed based on takt time and queue times (e.g., a schedule based on the takt time and queue times), the robots do not have conflicts. For example, robot PR1 finishes operation 5 prior to being used for operation 9 and finishes operation 9 prior to being used for operation 13.

Figure 4:
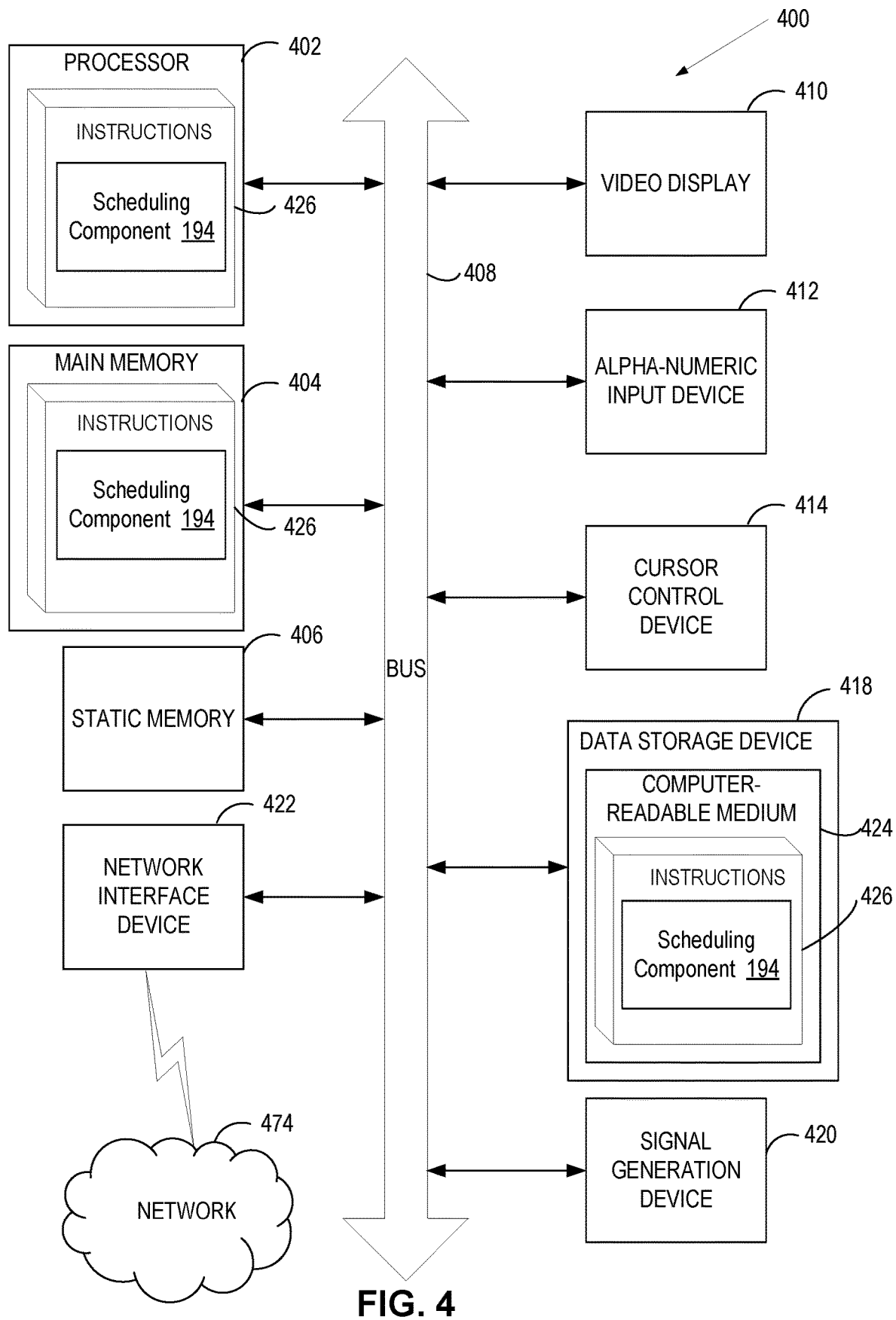
FIG. 4 is a block diagram illustrating a computer system, according to certain embodiments.

FIG. 4 is a block diagram illustrating a computer system 400, according to certain embodiments. In some embodiments, the computer system 400 is the client device 192. In some embodiments, the computer system 400 is the controller device 190 (e.g., server).

In some embodiments, computer system 400 is connected (e.g., via a network, such as a Local Area Network (LAN), an intranet, an extranet, or the Internet) to other computer systems. Computer system 400 operates in the capacity of a server or a client computer in a client-server environment, or as a peer computer in a peer-to-peer or distributed network environment. In some embodiments, computer system 400 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In some embodiments, the computer system 400 includes a processing device 402, a volatile memory 404 (e.g., Random Access Memory (RAM)), a non-volatile memory 406 (e.g., Read-Only Memory (ROM) or Electrically-Erasable Programmable ROM (EEPROM)), and/or a data storage device 416, which communicates with each other via a bus 408.

In some embodiments, processing device 402 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor). In some embodiments, processing device 402 is provided by one or more of a single processor, multiple processors, a single processor having multiple processing cores, and/or the like.

In some embodiments, computer system 400 further includes a network interface device 422 (e.g., coupled to network 474). In some embodiments, the computer system 400 includes one or more input/output (I/O) devices. In some embodiments, computer system 400 also includes a video display unit 410 (e.g., an LCD), an alphanumeric input device 412 (e.g., a keyboard), a cursor control device 414 (e.g., a mouse), and/or a signal generation device 420.

In some implementations, data storage device 416 (e.g., disk drive storage, fixed and/or removable storage devices, fixed disk drive, removable memory card, optical storage, network attached storage (NAS), and/or storage area-network (SAN)) includes a non-transitory computer-readable storage medium 424 on which stores instructions 426 encoding any one or more of the methods or functions described herein, including instructions encoding components of FIG. 1 (e.g., scheduling component 194, etc.) and for implementing methods described herein. In some embodiments, the processor 402 includes scheduling component 194. In some embodiments, generated takt time, queue times, and/or schedule are stored in data storage device 418.

In some embodiments, instructions 426 also reside, completely or partially, within volatile memory 404 and/or within processing device 402 during execution thereof by computer system 400, hence, volatile memory 404 and processing device 402 also constitute machine-readable storage media, in some embodiments.

While computer-readable storage medium 424 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. Further, the methods, components, and features are implemented in any combination of hardware devices and computer program components, or in computer programs.

Unless specifically stated otherwise, terms such as "identifying," "calculating," "determining," "causing," "receiving," "generating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. Such a computer program is stored in a computer-readable tangible storage medium.

The methods and illustrative examples described herein are not inherently related to any particular computer or other apparatus. Various general purpose systems are used in accordance with the teachings described herein, or, in some embodiments, it proves convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   identifying a bottleneck operation of a plurality of operations in a sequence recipe, wherein the plurality of operations are associated with transporting and processing a plurality of substrates in a substrate processing system;
   determining, based on the bottleneck operation, a takt time for the plurality of substrates, wherein the takt time is an amount of time between a first substrate entering the substrate processing system and a second substrate entering the substrate processing system;
   determining a plurality of queue times, wherein each of the plurality of queue times corresponds to a respective operation of the plurality of operations;
   generating a schedule based on the takt time and the plurality of queue times; and
   transmitting the schedule to a controller of the substrate processing system, wherein the controller is to control the substrate processing system to process the plurality of substrates based on the schedule.

2. The method of claim 1 further comprising:
receiving topology information and historical timing information associated with the substrate processing system, wherein the identifying of the bottleneck operation is based on the topology information and the historical timing information.

3. The method of claim 1, wherein after the first substrate has entered the substrate processing system, causing each remaining substrate of the plurality of substrates is to enter the substrate processing system at a corresponding time that is the takt time after a corresponding previous time of a corresponding previous substrate of the plurality of substrates entering the substrate processing system.

4. The method of claim 1 further comprising:
generating sequence recipe constraints with queue variables for the plurality of operations, wherein the determining of the plurality of queue times comprises using a linear programming solver to solve the queue variables from the sequence recipe constraints.

5. The method of claim 1, wherein the determining of the plurality of queue times is to resolve robot conflicts of the substrate processing system.

6. The method of claim 1, wherein the plurality of operations comprises a revisiting sequence, and wherein the method further comprises converting the revisiting sequence to a non-revisiting sequence comprising a sub-sequence that is performing the revisiting sequence.

7. A non-transitory machine-readable storage medium storing instructions which, when executed cause a processing device to:
identify a bottleneck operation of a plurality of operations in a sequence recipe, wherein the plurality of operations are associated with transporting and processing a plurality of substrates in a substrate processing system;
determine, based on the bottleneck operation, a takt time for the plurality of substrates, wherein the takt time is an amount of time between a first substrate entering the substrate processing system and a second substrate entering the substrate processing system;
determine a plurality of queue times, wherein each of the plurality of queue times corresponds to a respective operation of the plurality of operations;
generate a schedule based on the takt time and the plurality of queue times; and
transmit the schedule to a controller of the substrate processing system, wherein the controller is to control the substrate processing system to process the plurality of substrates based on the schedule.

8. The non-transitory machine-readable storage medium of claim 7, wherein the processing device is further to:
receive topology information and historical timing information associated with the substrate processing system, and wherein the processing device is to identify the bottleneck operation based on the topology information and the historical timing information.

9. The non-transitory machine-readable storage medium of claim 7, wherein after the first substrate has entered the substrate processing system, cause each remaining substrate of the plurality of substrates is to enter the substrate processing system at a corresponding time that is the takt time after a corresponding previous time of a corresponding previous substrate of the plurality of substrates entering the substrate processing system.

10. The non-transitory machine-readable storage medium of claim 7, wherein the processing device is further to:
generate sequence recipe constraints with queue variables for the plurality of operations, wherein to determine the plurality of queue times, the processing device is to use a linear programming solver to solve the queue variables from the sequence recipe constraints.

11. The non-transitory machine-readable storage medium of claim 7, wherein to determine the plurality of queue times, the processing device is to resolve robot conflicts of the substrate processing system.

12. The non-transitory machine-readable storage medium of claim 7, wherein the plurality of operations comprises a revisiting sequence, and wherein the processing device is further to convert the revisiting sequence to a non-revisiting sequence comprising a sub-sequence that is performing the revisiting sequence.

13. A system comprising:
memory; and
a processing device coupled to the memory, the processing device to:
identify a bottleneck operation of a plurality of operations in a sequence recipe, wherein the plurality of operations are associated with transporting and processing a plurality of substrates in a substrate processing system;
determine, based on the bottleneck operation, a takt time for the plurality of substrates, wherein the takt time is an amount of time between a first substrate entering the substrate processing system and a second substrate entering the substrate processing system;
determine a plurality of queue times, wherein each of the plurality of queue times corresponds to a respective operation of the plurality of operations;
cause, based on the takt time and the plurality of queue times, the plurality of substrates to be processed by the substrate processing system;
generate a schedule based on the takt time and the plurality of queue times; and
transmit the schedule to a controller of the substrate processing system, wherein the controller is to control the substrate processing system to process the plurality of substrates based on the schedule.

14. The system of claim 13, wherein the processing device is further to:
receive topology information and historical timing information associated with the substrate processing system, and wherein the processing device is to identify the bottleneck operation based on the topology information and the historical timing information.

15. The system of claim 13, wherein after the first substrate has entered the substrate processing system, each remaining substrate of the plurality of substrates is to enter the substrate processing system at a corresponding time that is the takt time after a corresponding previous time of a corresponding previous substrate of the plurality of substrates entering the substrate processing system.

16. The system of claim 13, wherein the processing device is further to:
generate sequence recipe constraints with queue variables for the plurality of operations, wherein to determine the plurality of queue times, the processing device is to use a linear programming solver to solve the queue variables from the sequence recipe constraints.

17. The system of claim 13, wherein to determine the plurality of queue times, the processing device is to resolve robot conflicts of the substrate processing system.

* * * * *